July 15, 1958 J. H. GUYTON 2,843,744

TRANSISTOR OSCILLATOR STARTING CIRCUIT

Filed Nov. 14, 1955

INVENTOR
James H. Guyton
BY E. W. Christen
ATTORNEY 2,843,744
Patented July 15, 1958

2,843,744

TRANSISTOR OSCILLATOR STARTING CIRCUIT

James H. Guyton, Kokomo, Ind., assignor to General Motors Corporation, Detroit, Mich., a corporation of Delaware Application November 14, 1955, Serial No. 546,547
7 Claims. (Cl. 250—36)

This invention relates to transistor oscillator circuits and more particularly to means for initiating oscillations in such circuits.

Since the advent of transistor or semi-conductor current amplifying devices in the field of electronics many circuit arrangements have been developed for utilizing such devices as oscillation generators. Oscillations are generally initiated by a starting current in the input circuit and in the feedback type oscillator the oscillations are sustained by energy supplied from the output circuit. It has been a common practice to supply the starting current from a voltage source separate from the output voltage source or from a voltage divider impedance connected to the output voltage source. These prior art arrangements are subject to disadvantages in that they require numerous circuit elements or impose limitations upon the circuit arrangements.

Accordingly, it is an object of this invention to provide an improved starting circuit for a transistor oscillator requiring a minimum of circuit elements.

A more particular object is to provide a transistor oscillator starting circuit which is energized from the output circuit voltage source.

A further object is to provide a transistor oscillator having a single voltage source adapted to initiate and sustain oscillations in the output circuit.

An additional object is the provision of a transistor oscillator having a single voltage source adapted to initiate oscillations upon energization of the output circuit.

In the accomplishment of these objects there is provided circuit means for accumulating a starting voltage from the output circuit voltage source during non-operating intervals and for supplying the starting voltage to the input circuit to initiate oscillations for the operating intervals.

A more complete understanding of the invention may be had from the detailed description that follows taken with the accompanying drawings in which.

Figure 1:
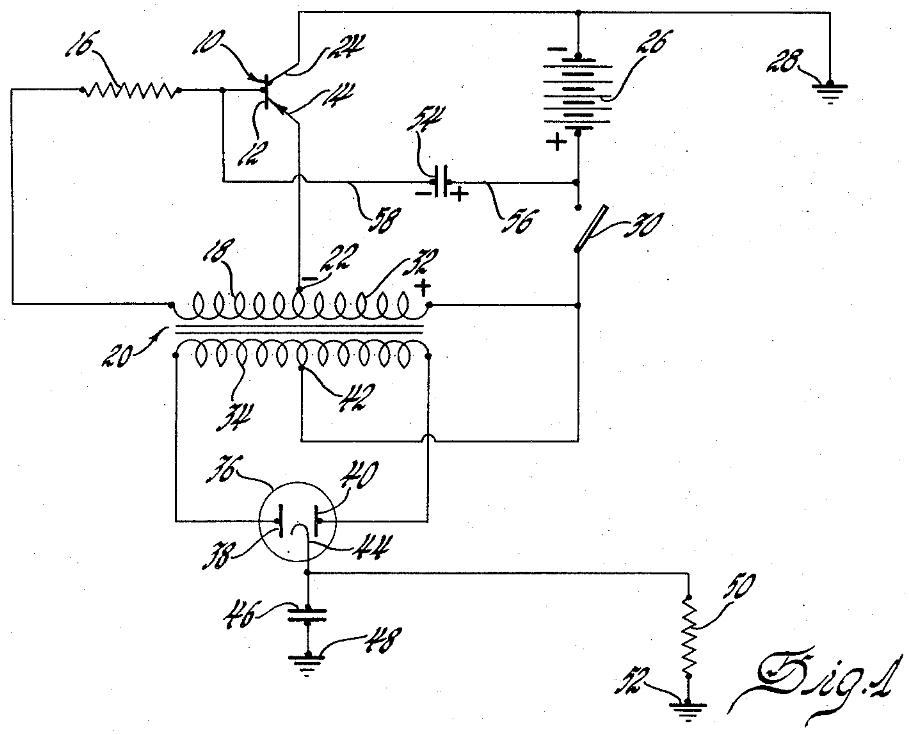
Figure 1 is a schematic diagram showing one embodiment of the invention in a transistor oscillator.

Referring now to the drawings, there is shown an illustrative embodiment of the invention in a feedback type transistor oscillator suitably employed as an inverter for developing a relatively high direct voltage from a low direct voltage source. The oscillator of Figure 1 comprises a transistor 10 having emitter electrode 14, collector electrode 24 and base electrode 12. The transistor employed in the illustrative embodiment is of the P–N–P configuration in which the emitter and collector are of P type material having holes as the majority carriers and the base is of N type material having electrons as majority carriers. It will be apparent that the transistor may be either the point contact or junction type and that a N–P–N configuration may be employed, if desired, with a suitable reversal of polarities.

The input circuit of the transistor 10, extending between the base electrode 12 and emitter electrode 14, includes a base circuit resistor 16 having one terminal electrically connected to the base electrode 12 and the other terminal connected to one terminal of a feedback winding 18 of transformer 20. The input circuit is completed by a connection of common terminal or tap 22 on winding 18 to emitter electrode 14. The output circuit of the transistor 10, extending between collector electrode 24 and emitter electrode 14, includes a direct voltage source such as the battery 26 having the negative terminal connected to the collector electrode 24 and to a point of reference potential or ground 28. The positive terminal of battery 26 is connected through a starting switch 30 to one terminal of a transformer primary winding 32. The output circuit is completed by connection of winding 32 from common terminal 22 to the emitter electrode 14. The transformer windings provide a feedback path, through the inductive coupling between the winding 32 in the output circuit and the winding 18 in the input circuit, to sustain oscillations in the output circuit.

The oscillating voltage of the output circuit may be suitably transformed to any desired voltage level by the secondary winding 34 of transformer 20. A rectifier comprising a duo-diode 36 has one plate electrode 38 connected to one terminal of the secondary winding 34 and the other plate electrode 40 connected to the other terminal of the secondary winding. A center tap 42 of the transformer secondary winding 34 is connected through switch 30 and battery 26 to ground 28. The rectifier circuit is completed by the connection of cathode electrode 44 through filter condenser 46 to ground 48. Any suitable load or utilization device represented by resistor 50 is connected between cathode 44 and ground 52.

The oscillation circuit thus far described is disclosed and claimed in co-pending application S. N. 512,176 filed May 31, 1955, in the names of Guyton et al. and assigned to the same assignee as the present invention.

The starting circuit, in accordance with this invention, for initiating oscillations comprises voltage accumulating means or condenser 54 having one terminal connected by conductor 56 to the positive terminal of battery 26 and the other terminal connected by conductor 58 to the base electrode 12 of transistor 10. A series circuit is thus established including the battery 26, condenser 54, transistor base electrode 12 and collector electrode 24.

In operation of the circuit of Figure 1, oscillations are initiated by a momentary or transient starting current between emitter electrode 14 and base electrode 12 in the input circuit. Consider first the oscillator in the non-operating condition, which obtains with starting switch 30 open because no voltage is applied between the emitter electrode 14 and collector electrode 24. In this non-operating condition a series circuit is maintained which extends from the positive terminal of battery 26 through condenser 54, to transistor base electrode 12 and thence to transistor collector electrode 24 to the negative terminal of battery 26. The resistance between base electrode 12 and collector electrode 24 is typically of a magnitude in the range of one megohm for junction type transistors and of a few kilohms for point contact type transistors. Thus during a non-operating interval of the oscillator, a leakage or charging current will flow in the series circuit just described until the condenser 54 assumes the voltage of the polarity indicated which is approximately equal to the voltage of battery 26.

Upon energization of the output circuit by closing starting switch 30 a discharge path, which includes a portion of the input circuit, is established for condenser 54. A current is caused to flow from one terminal of the charged condenser 54 through conductor 56, switch 30 and transformer winding 32 to emitter electrode 14 and thence to base electrode 12 and the other terminal of condenser 54. It is noted that a parallel path for the discharge current exists from the terminal 22 through winding 18 and resistor 16, and conductor 58 to the condenser 54. The impedance presented by the winding 18 and by the resistor 16 limits the current flow through this parallel path. As a result, a substantial part of the discharge or starting current flows from the emitter electrode 14 to the base electrode 12.

The starting current is, of course, in the low resistance direction from emitter electrode 14 to the base electrode 12. This effectively decreases the impedance between the emitter electrode 14 and collector electrode 24 and an initially small current flows in the output circuit. An induced voltage with the polarity indicated appears across winding 32 and by virtue of inductive coupling a feedback voltage with like polarity is developed across winding 18. This feedback voltage causes additional current to flow from the emitter to the base electrode and as a result, the current from the emitter to the collector electrode increases. This action is cumulative and the current in the output circuit increases exponentially to a limiting value determined by the circuit parameters. At this limiting value the feedback voltage decreases toward zero and will no longer sustain emitter to collector current and the output circuit current commences to decrease abruptly terminating the first half-cycle. At this point, the magnetic field of the transformer collapses reversing the voltage polarity across the transformer windings during the second half-cycle. Following the second half-cycle the condenser 54 delivers a starting current in the low impedance direction from the emitter electrode 14 to the base electrode 12 to initiate the second cycle of oscillation. This action is repetitive in the manner described to sustain continued oscillations.

The alternating voltage developed across winding 32 appears at a transformed value across transformer secondary winding 34. On alternate half-cycles the plate electrodes 38 and 40 are rendered conductive by the voltage developed across secondary winding 34. Thus, a full wave rectified voltage appears across filter condenser 46 and load device 50. It is noted that the battery 26 is connected between the center tap 42 of transformer secondary winding 34 and ground 28. This connection combines the battery voltage and transformer secondary voltage additively and increases the net output voltage accordingly. The over-all efficiency of the system is thus improved by reason of the increased voltage.

Figure 2:
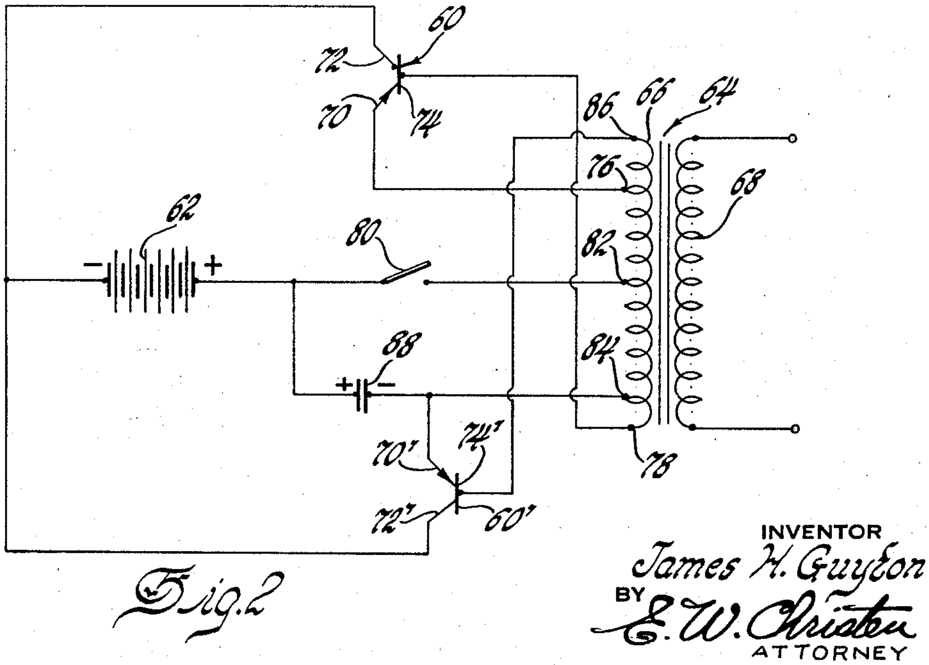
Figure 2 is a schematic diagram of a transistor oscillator in a push-pull connection embodying the invention.

In Figure 2 the inventive starting circuit is embodied in a push-pull connected transistor oscillator circuit. In this illustrative embodiment the oscillator comprises a pair of transistors 60 and 60′ of P–N–P configuration, a voltage source such as battery 62 and an output transformer 64 having a primary winding 66 and secondary winding 68. The transistor 60 includes an emitter electrode 70, collector electrode 72, and base electrode 74. The input circuit of transistor 60 extending from emitter electrode 70 to base electrode 74 includes that portion of winding 66 between intermediate tap 76, which is conductively connected to the emitter electrode, and terminal 78, which is connected to base electrode 74. The output circuit extends from collector electrode 72 to the negative terminal of battery 62 and from the positive terminal through starting switch 80 to the center tap 82 on winding 66. The output circuit is completed from the center tap 82 through winding 66 to intermediate tap 76 and thence to emitter electrode 70. Transistor 60′ includes an emitter electrode 70′, collector electrode 72′, and base electrode 74′. The input circuit between emitter and base electrodes includes that portion of winding 66 between intermediate tap 84, which is connected to emitter electrode 70′, and terminal 86, which is connected to base electrode 74′. The output circuit extends from collector electrode 72′ to the negative terminal of battery 62 and from positive terminal through switch 80 to center tap 82 on winding 66. The output circuit is completed through a portion of winding 66 by connection of intermediate tap 84 to emitter electrode 70′.

A starting circuit for initiating oscillations comprises the connection of the condenser 88 between the positive terminal of battery 62 and the tap 84 on winding 66. With switch 80 open, a charging circuit is maintained for condenser 88 which extends from battery 62, through condenser 88 to tap 84 and thence through winding 66 to terminal 78, through transistor 60 from base electrode 74 to collector electrode 72, and back to battery 62. A similar charging circuit also exists from battery 62 through condenser 88 to tap 84 and through winding 66 to terminal 86 and thence through transistor 60′ between base electrode 74′ and collector electrode 72′, back to battery 62. Thus the condenser 88 maintains a charge of the polarity indicated during non-operating periods of the oscillator circuit.

Operation of the oscillator is initiated by closing the starting switch 80 which completes a discharge path for the condenser 88 extending from one terminal thereof through switch 80 to center tap 82 and through winding 66 to intermediate tap 84, and thence to the other terminal of condenser 88. The transient current delivered through this path develops an induced voltage in winding 66 which appears between tap 76 and terminal 78 and is applied across emitter electrode 70 and base electrode 74 in the low impedance direction. This causes a starting current to flow in the input circuit of transistor 60 which permits an output current to flow from battery 62 through switch 80, winding 66 between taps 82 and 76, and thence from emitter electrode 70 to collector electrode 72 and back to battery 62. This current in the output circuit of transistor 60 develops an induced voltage in winding 66 which is applied to the input circuit of transistor 60′. This voltage appearing between tap 84 and terminal 86 is applied across emitter electrode 70′ and base electrode 74′ in the low impedance direction and causes a starting current for transistor 60′. This starting current permits an output current to flow from battery 62 through switch 80 to center tap 82 and through winding 66 to intermediate tap 84 and thence through emitter electrode 70′ and collector electrode 72′ to battery 62.

The first cycle of oscillation is thus completed by alternate conduction of the transistors 60 and 60′. The conduction of the output circuit of the transistor 60′ through winding 66 develops a starting voltage and current which is applied to the input circuit of transistor 60 to initiate the second cycle of oscillation. This action is repetitive at the oscillation frequency to maintain sustained oscillations which develop an alternating output voltage across the terminals of secondary winding 68 for any desired utilization. The oscillation is interrupted and initiated at will by opening or closing, respectively, the starting switch 80.

Although the description of this invention has been set forth with respect to particular embodiments it is not to be construed in a limiting sense. Many modifications and variations within the spirit and scope of the invention will now occur to those skilled in the art. For a definition of the invention, reference is made to the appended claims.

I claim:

1. A starting circuit for an oscillator which utilizes a transistor amplifying device having collector, emitter, and base electrodes, comprising a voltage source connected between the collector and emitter electrodes, voltage accumulating means and a switch serially connected between the base and emitter electrodes, and a conductive connection between a point intermediate the switch and accumulating means and one terminal of the source.

2. A transistor oscillator comprising a transistor having emitter, collector, and base electrodes, an input circuit extending between the emitter and base electrodes, an output circuit including a voltage source and a starting switch extending between the emitter and collector electrodes, and a starting circuit including a condenser connected between said base electrode and a point intermediate said voltage source and said switch.

3. In an oscillator of the type including a transistor having emitter, collector, and base electrodes, an input circuit extending between the emitter and base electrodes, an output circuit including a voltage source and a starting switch extending between the emitter and collector electrodes, feedback means coupling the output circuit to the input circuit to sustain oscillations in the output circuit, the improvement comprising a starting circuit including a condenser connected in series circuit between the base electrode and a point intermediate said switch and said voltage source.

4. A transistor oscillator comprising a transistor having emitter, collector and base electrodes, an input circuit extending between the emitter and base electrodes and including a resistor, an output circuit extending between the emitter and collector eletcrodes and including a voltage source and a starting switch, and a condenser connected between the base electrode and a point intermediate said switch and said voltage source.

5. A transistor oscillator comprising a transistor having emitter, collector, and base electrodes, a transformer having primary, secondary, and feedback windings, an input circuit extending from said base electrode through a resistor and the feedback winding to the emitter electrode, an output circuit extending from the collector electrode through a voltage source, a starting switch, and the primary winding to the emitter electrode, a starting circuit including a condenser connected from a point intermediate the resistor and base electrode to a point intermediate the voltage source and the switch, and a rectifier and a utilization circuit connected across the secondary winding.

6. A transistor oscillator comprising a transistor having emitter, collector, and base electrodes, a transformer having primary, secondary, and feedback windings, an input circuit extending from said base electrode through a resistor and the feedback winding to the emitter electrode, an output circuit extending from the collector electrode through a voltage source, a starting switch, and the primary winding to the emitter electrode, one terminal of said source and said collector electrode being connected to a point of reference potential, the other terminal of said source being connected through a starting condenser to said base electrode, a center tap on said secondary winding connected to one terminal of said switch, and a full wave rectifier and a utilization device connected between the terminals of said secondary winding and the point of reference potential.

7. A starting circuit for an oscillator which utilizes a transistor amplifying device having collector, emitter, and base electrodes comprising a voltage source connected between the collector and emitter electrodes, a condenser connected serially with said voltage source between the collector and base electrodes whereby the condenser is charged by current leakage between the collector and base electrodes, and a starting circuit connected across the emitter and base electrodes including a switch and said condenser for supplying starting current from the condenser to said transistor upon closing of said switch.

References Cited in the file of this patent

UNITED STATES PATENTS

| | | |
|---|---|---|
| 2,811,643 | Eberhard | Oct. 29, 1957 |

OTHER REFERENCES

"Transistors in Telemetry," by Riddle, pp. 178–80 of Electronics for January 1954.

"Transistor Power Supply for Geiger Counter," by Pearlman, pp. 114–45 of Electronics for August 1954.